(12) United States Patent
Bourdelle et al.

(10) Patent No.: US 7,871,900 B2
(45) Date of Patent: Jan. 18, 2011

(54) QUALITY OF A THIN LAYER THROUGH HIGH-TEMPERATURE THERMAL ANNEALING

(75) Inventors: Konstantin Bourdelle, Crolles (FR); Nguyet-Phuong Nguyen, Grenoble (FR); Walter Schwarzenbach, Saint Nazaire les Eymes (FR)

(73) Assignee: S.O.I. Tec Silicon on Insulator Technologies, Bernin (FR)

( * ) Notice: Subject to any disclaimer, the term of this patent is extended or adjusted under 35 U.S.C. 154(b) by 734 days.

(21) Appl. No.: 11/873,299

(22) Filed: Oct. 16, 2007

(65) Prior Publication Data

US 2008/0237804 A1    Oct. 2, 2008

(30) Foreign Application Priority Data

Mar. 29, 2007    (FR) .................................. 07 54131

(51) Int. Cl.
*H01L 21/30* (2006.01)
(52) U.S. Cl. ................. 438/458; 438/455; 257/E27.112
(58) Field of Classification Search ................ 438/455, 438/458; 257/E27.112
See application file for complete search history.

(56) References Cited

U.S. PATENT DOCUMENTS

| | | | |
|---|---|---|---|
| 2003/0216008 A1 | 11/2003 | Schwarzenbach et al. | ... 438/458 |
| 2004/0262686 A1 | 12/2004 | Shaheen et al. | ............. 257/347 |
| 2005/0026426 A1 | 2/2005 | Maleville et al. | ............ 438/663 |
| 2006/0040470 A1 | 2/2006 | Ben Mohamed et al. | .... 438/458 |
| 2006/0046431 A1* | 3/2006 | Blietz et al. | ................. 438/455 |

FOREIGN PATENT DOCUMENTS

| EP | 1359615 | 11/2003 |
|---|---|---|
| EP | 1628339 | 2/2006 |
| FR | 2858462 | 2/2005 |
| WO | WO 2005/086228 | 9/2005 |

OTHER PUBLICATIONS

G. Celler, *Frontiers of Silicon-on-Insulator*, Journal of Applied Physics, vol. 93, No. 9, pp. 4955-4978 (2003).
French Search Report of FR 0754131.

* cited by examiner

*Primary Examiner*—Zandra Smith
*Assistant Examiner*—Christy L Novacek
(74) *Attorney, Agent, or Firm*—Winston & Strawn LLP

(57) ABSTRACT

A method for forming a structure is provided and includes implanting an atomic species into a donor substrate having an upper surface at a given depth relative to the upper surface to form an embrittlement zone in the donor substrate, the embrittlement zone defining a removable layer within the donor substrate. The method further includes assembling the upper surface of the donor substrate to a receiver substrate. Additionally, the method includes detaching the removable layer from the donor substrate at the embrittlement zone, thereby forming a detachment surface on the removable layer, by high temperature annealing. The high temperature annealing includes a temperature upgrade phase to a predetermined maximum temperature, maintaining the maximum temperature for a predetermined exposure duration, and a temperature downgrade phase. The maximum temperature and the exposure duration are selected so as to prevent the appearance of significant defects at the detachment surface.

20 Claims, 5 Drawing Sheets

QUALITY OF A THIN LAYER THROUGH HIGH-TEMPERATURE THERMAL ANNEALING

BACKGROUND OF THE INVENTION

The present invention relates to the production of composite structures implemented for applications in the fields of microelectronics, optics and/or optoelectronics. More precisely, the invention relates to a general method of forming a structure comprising a layer in a semiconductor material taken from a donor substrate, such a method typically includes the following successive steps:

implantation of atomic species to form an embrittlement zone in a donor substrate at a given depth;
assembly of the donor substrate to a receiver substrate;
supply of energy to detach the layer taken from the donor substrate at the embrittlement zone; and
finishing treatment for the layer removed to improve its surface condition.

The types of methods mentioned above are already known to the person skilled in the art. SMART-CUT® methods are one example that corresponds to a preferred embodiment of the invention. Such methods allow structures having a thin layer in a semiconductor material to be produced. In order to obtain specifics on the abovementioned technology, the person skilled in the art may, for example, refer to by G. Celler, *Frontiers of Silicon-on-Insulator*, Journal of Applied Physics, Vol 93, no. 9, May 1, 2003, pages 4955-4978. The structures presently described are of the Silicon On Insulator (SOI) type, in which the layer taken is in silicon, or of the strained SOI (sSOI) type, in which the layer taken is in strained silicon. Other types of composite structures may also be obtained.

Further concerning implanting the general method for fabricating SOI or similar structures, the implantation step includes implanting one or more ionized species in the donor substrate which subsequently will form a zone of defects that are more or less buried within the substrate at a depth that at least partially depends on the implantation energy. These defects will be able to develop and will be used in the detachment step. The energy utilized in the detachment step is at least partly supplied in thermal form by a process referred to herein as detachment annealing. During heat annealing, the moment when the layer to be removed form the donor substrate detaches will depend on both the temperature at which the process is carried out and the duration of the exposure to the temperature. This pair of factors is known as the "heat budget." Beyond the heat budget, temperature distribution (between the top and the bottom of the oven) is also important.

After the detachment step, roughness, imperfections, or reduction in the crystalline quality of the separation surface of the removed layer may generally be observed. Given the specified applications for these substrates, the requirements for the surface condition of the structures utilized are generally very strict: the roughness of the thin layer is a parameter that to a certain extent determines the quality of the components that will be made on the structure. To treat these surface defects, a finishing treatment may be implemented with the object of conforming to the final roughness requirements that the free face of the substrate must meet for its subsequent use. These finishing steps correspond to additional steps of the method which tend to make the method more complex and more costly.

A known method to reduce surface defects such as those mentioned above consists of carrying out detachment annealing at a "high temperature," which usually corresponds to a temperature of over 500° C. US Patent Application Pub. No. 2003/0216008 and International Patent Application Pub. No. WO 2005/086228 provide examples of such detachment annealings, particularly by exposing the wafers to a high temperature for a given duration in order to initiate detachment. These references demonstrate that roughness is reduced when detachment annealing is performed in part at a high temperature, which consequently allows the finishing step to be simplified. In fact, it is thought that the act of prolonging detachment annealing at a high temperature allows certain surface defects issued from the detachment to be "healed." However, the act of carrying out detachment annealing at such temperatures produces an undesirable effect in that it is sometimes difficult to detach the donor substrate from the structure produced. This effect is generally explained by a reattachment phenomenon of the donor substrate and of the structure produced at the detachment interface when the assembly is subjected to a high temperature.

SUMMARY OF THE INVENTION

The present invention provides a process to mitigate the abovementioned problems and particularly to enable the implementation of high temperature detachment annealing by reducing the risk of reattachment. For this purpose, the invention provides a method for forming a structure including implanting an atomic species into a donor substrate having an upper surface at a given depth relative to the upper surface to form an embrittlement zone in the donor substrate, the embrittlement zone defining a removable layer within the donor substrate. The method further includes assembling the upper surface of the donor substrate to a receiver substrate. Additionally, the method includes detaching the removable layer from the donor substrate at the embrittlement zone, thereby forming a detachment surface on the removable layer, by high temperature annealing. The high temperature annealing includes high temperature annealing which includes a temperature upgrade phase for heating to a predetermined maximum temperature, a maximum temperature maintaining phase for a predetermined exposure duration, and a temperature downgrade phase. The maximum temperature and the exposure duration are selected so as to prevent the appearance of significant defects at the detachment surface.

In one embodiment of the present invention, the duration of exposure to the maximum temperature is preferably less than or equal to a limit that is a linear function of the maximum temperature. The linear function is preferably of the form: $D=-\frac{3}{5}HT+450$, where HT and D are, respectively, the maximum temperature expressed in degrees Celsius and the duration of exposure to the high temperature expressed in minutes. In a further embodiment, the duration of exposure to the maximum temperature is equal to the limit. Alternatively, the duration of exposure to the high temperature is null in such a way that the upgrade is immediately followed by the temperature downgrade phase (for example, a descending ramp) during which the temperature decreases.

Preferably, in the temperature upgrade phase, the temperature increases a rate of about 10° C. per minute. Further preferably, in the temperature downgrade phase, the temperature decreases at a rate of about 10° C. per minute. The maximum temperature reached during the temperature upgrade phase is preferably greater than 500° C., and further preferably greater than 600° C., and still further preferably between 700° C. and 750° C.

In a preferred embodiment, the implantation phase includes co-implantation, preferably of hydrogen and helium species, preferably by implanting the hydrogen first.

In addition, the invention relates to a silicon on insulator type structure obtained by the method of the invention. This structure includes a receiver substrate and a removable layer assembled onto the receiver substrate. The removable layer has a detachment surface that has a roughness of about 10 Angstroms RMS for a 10×10 µm² area of the surface.

BRIEF DESCRIPTION OF THE DRAWINGS

Other characteristics and advantages of the invention will further emerge from the following description, which is purely illustrative and non-limiting and must be read with regard to the attached figures in which:

in FIG. 4a, 600° C. in FIG. 4b and 675° C. in FIG. 4c;

DETAILED DESCRIPTION OF THE PREFERRED EMBODIMENTS

Figure 1:
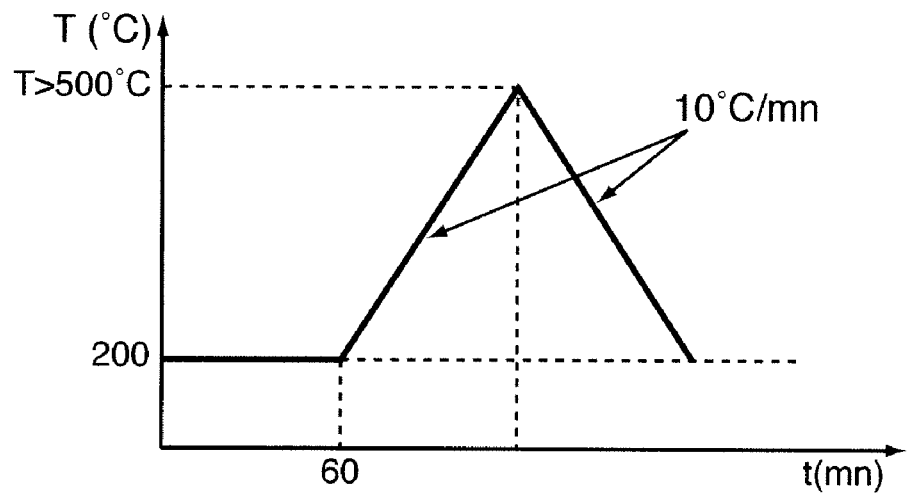
FIG. 1 is a graph of the heat budget implemented during detachment annealing in conformance with the present invention.

As has already been mentioned, the present invention relates to the production of structures including a layer in a semiconductor material that is taken from a donor substrate according to general the method previously discussed. The layer in such a semiconductor material is obtained by detachment at the location of the donor substrate that has been embrittled by the implantation of an atomic species. In particular, the present invention may improve the quality of the structure obtained by implementing the SMART-CUT® process or other such methods, particularly by reducing the roughness and defectivity of the structure obtained after detachment annealing, before possible finishing steps. The invention also allows for reduction of the possible finishing steps and therefore reduction of the time required to carry out the method.

In the context of the method according to the present invention, different conditions of implantation in a donor substrate and of detachment annealing were evaluated to obtain SOI type structures. The implantation step has accordingly been implemented according to three variations, referred to as H, H+He and He+H, in which:

H indicates implantation of hydrogen alone (conditions that will be discussed in the present text correspond to a concentration equal to $1.0 \times 10^{16}$ cm$^{-2}$ and an implantation energy equal to 32 keV);

He+H indicates sequential co-implantation of helium then hydrogen (conditions that will be discussed in the present text correspond to a concentration equal to $1.0 \times 10^{16}$ cm$^{-2}$ for each of the two species and implantation energies equal to 32 keV for hydrogen and 52 keV for helium); and H+He indicates sequential co-implantation of hydrogen then helium (conditions that will be discussed in the present text correspond to a concentration equal to $1.0 \times 10^{16}$ cm$^{-2}$ for each of the two species and implantation energies equal to 32 keV for hydrogen and 52 keV for helium).

In preferred embodiment, the invention will use a co-implantation step, which will be referred to generally herein as an implantation step, as one or more species are implanted. It is specified that co-implantation reduces the dose of species implanted.

After the implantation step, the assembly step is implemented by putting the donor substrate in contact with the receiver substrate to form an in-process unit. The in-process unit is then subjected to detachment annealing according to a change in the given temperature. In one embodiment of the present method, illustrated in FIG. 1, detachment annealing generally starts by maintaining a temperature equal to about 200° C. for approximately one hour, which contributes to reinforcing the bonding interface.

The temperature then increases according to an upgrade during which the temperature increases up to a maximum temperature that is greater than or equal to 500° C. Preferably, the upgrade is at a rate of about 10° C. per minute. In an exemplary embodiment (such as that depicted in FIG. 1), as soon as the high temperature is reached, the temperature is decreased immediately according to a downgrade (at a speed that may be 10° C. per minute) until a temperature on the order of 200° C. is reached; therefore, exposure to a high temperature is limited.

Figure 2:
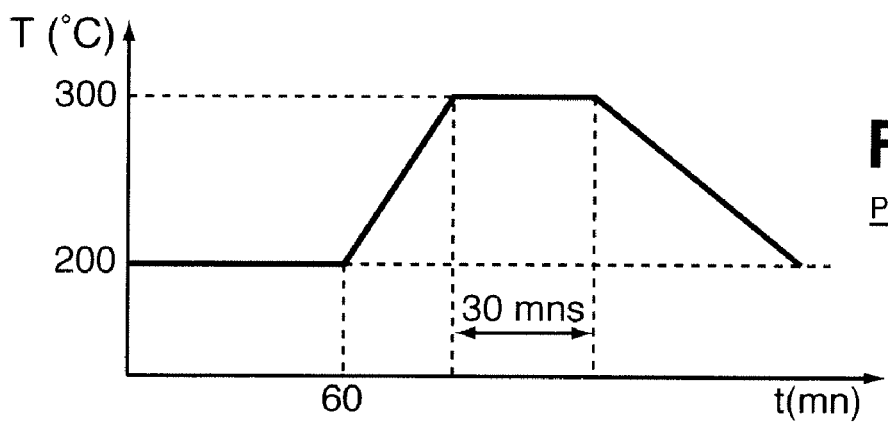
FIG. 2 is a graph of the prior art heat budget implemented during previously-known detachment annealing processes.

FIG. 2 illustrates an example of a known type of detachment annealing conducted using a maximum temperature that is sustained in a stabilized range for a predetermined duration on the order of 30 minutes.

In order to characterize the quality of the SOI structures following detachment annealing, the structures are subjected to several tests, which generally include a "roughness test" and a "defectivity test." These two types of tests indicate two distinct qualities of the structures. The roughness is that of the exposed surface of the transferred layer, after detachment. Known high temperature detachment annealings seek to reduce this roughness. As for defectivity, in the present text, this corresponds to defects of a substantially larger size than the representative roughness quantities. These defects correspond to partial tearings of the transferred layer. The defectivity therefore indicates possible reattachments of the layer after detachment but before transfer has been fully completed. In this text, the term "defect" corresponds to this defectivity and it therefore does not cover roughness, in particular.

The DWN haze measurement describes the average roughness measured on the entire surface of the structure obtained. This haze is measured by a process known as laser scanning confocal microscopy that may be conducted using an SPI upright microscope ("SPI scanning") and is carried out on the surface to be analyzed. The DWN haze measurement is based on the detection of the luminous intensity diffused by the wafer in response to a laser beam with a wavelength equal to 488 nm. The luminous intensity diffused is recovered by two channels of different sizes: a "narrow" channel (this is DNN haze) or a "large" channel (this is DWN haze).

Figure 3:
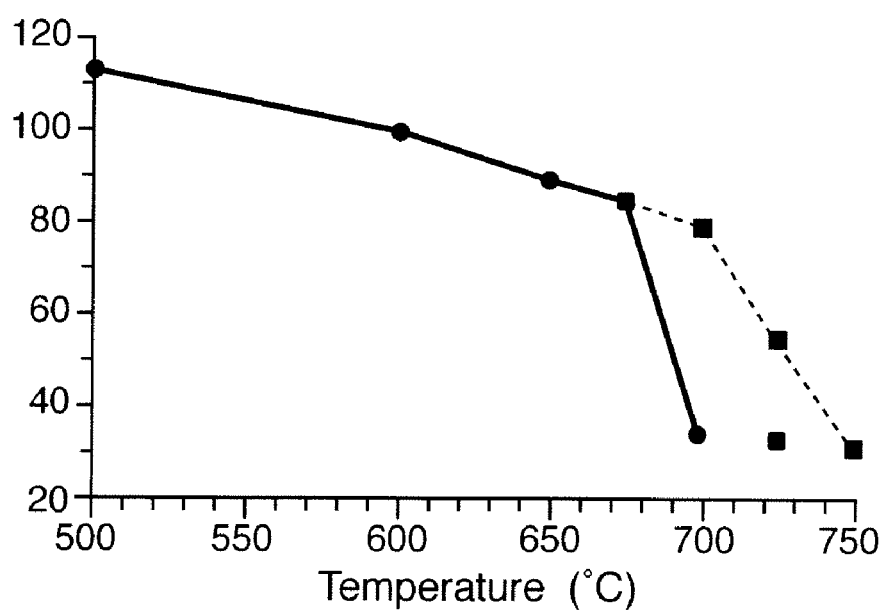
FIG. 3 is a graph of the average roughness (expressed in DWN Haze) of SOI structures after detachment according to the maximum temperature reached during detachment annealing, for durations of exposure to the maximum temperature equal to 0, 10, and 30 minutes, respectively.
Figure 4A:
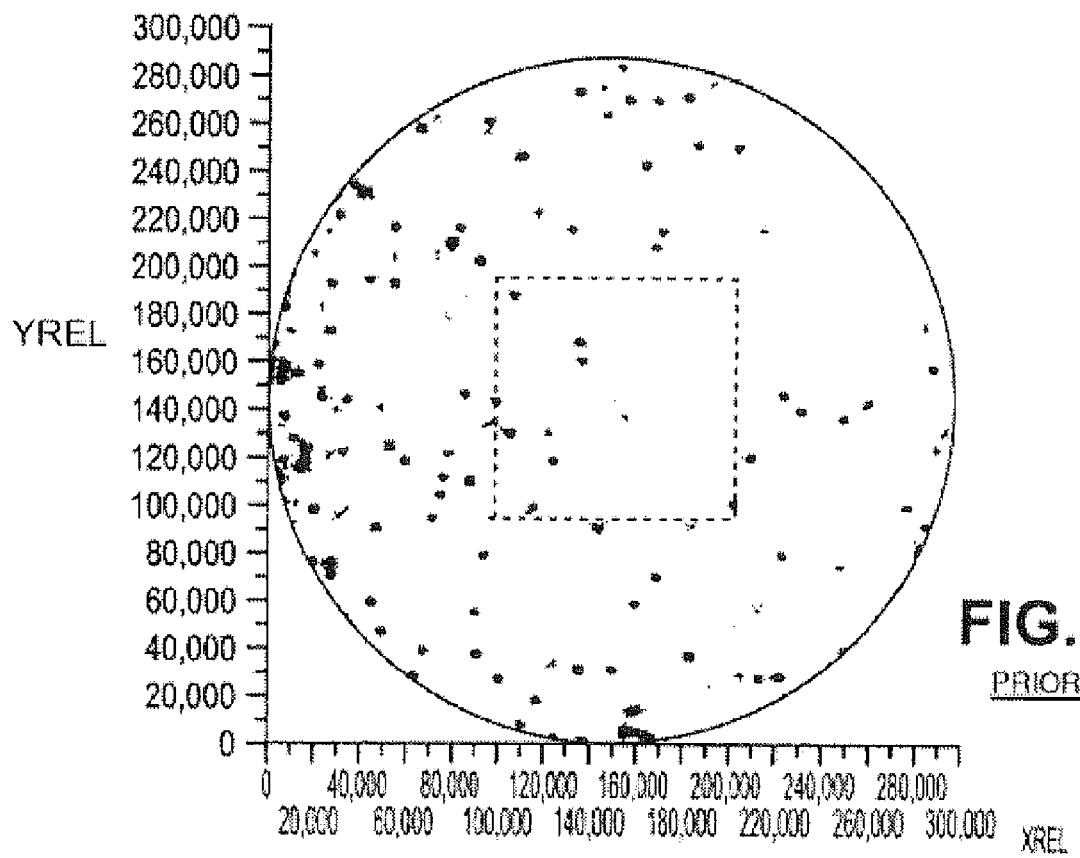
FIGS. 4a, 4b, and 4c are maps of defects observed after detachment on SOI structures obtained by implementing prior art detachment processes annealing in which exposure to the maximum temperature is of a duration equal to 30 minutes, the high temperature being equal to 500° C.
Figure 4B:
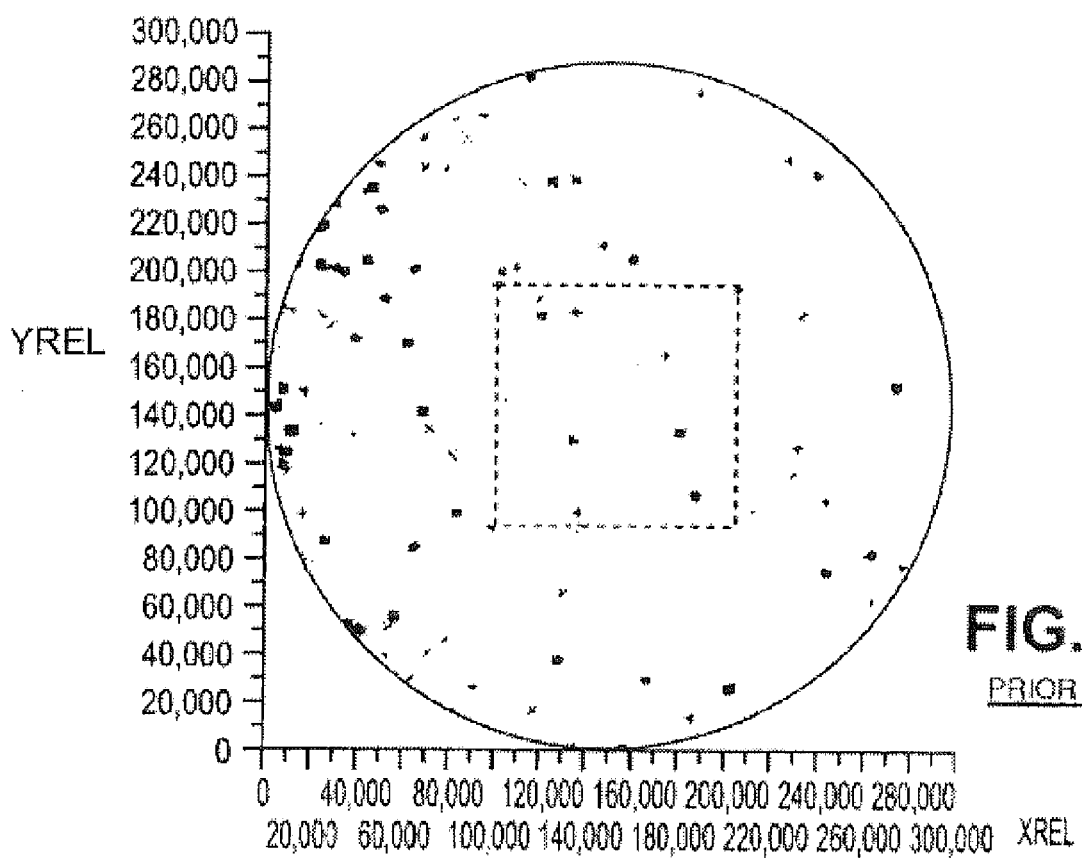
Figure 4C:
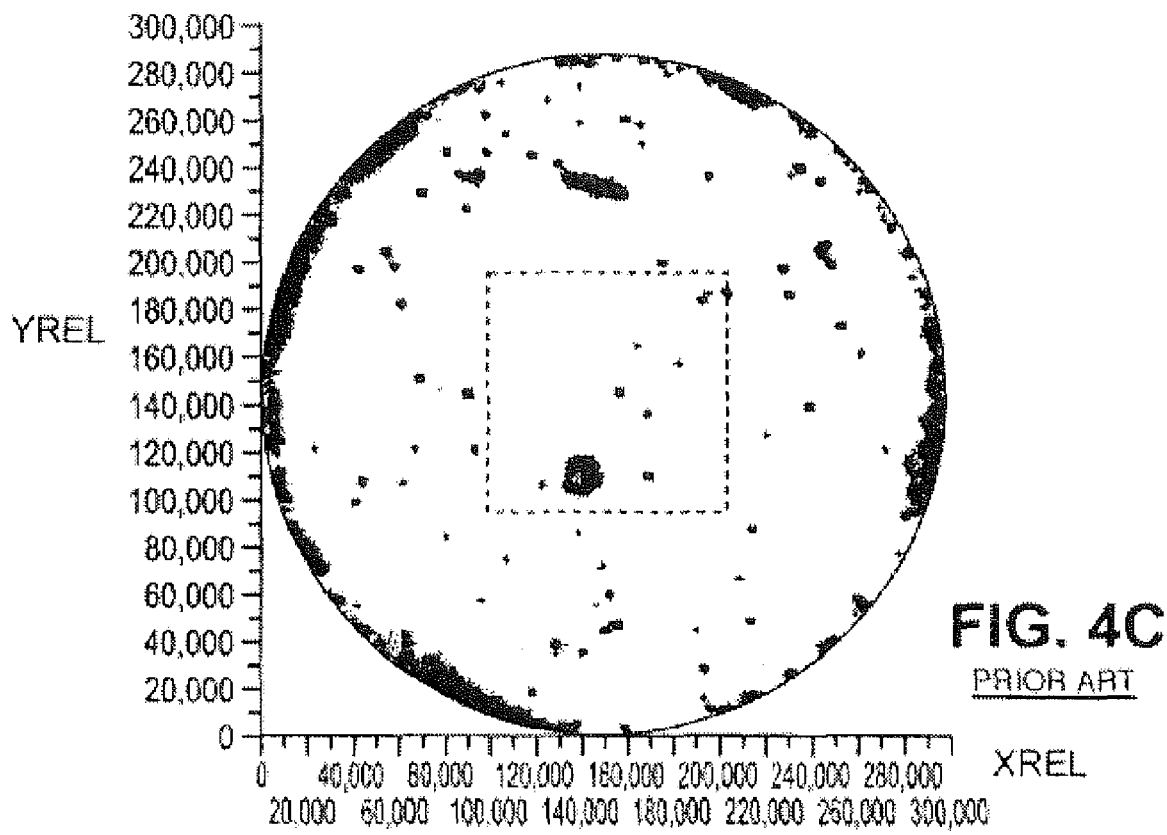

FIG. 3 represents the DWN haze of SOI structures after detachment according to the maximum temperature reached during detachment annealing, for durations of exposure to the maximum temperature equal to 0 (detachment annealing according to the an embodiment of the present invention), 10, and 30 minutes. FIGS. 4a, 4b and 4c represent defect maps observed by SPI scanning after detachment on SOI structures for various maximum detachment annealing temperatures, respectively equal to 500° C., 600° C. and 675° C. Exposure at these maximum temperatures is for 30 minutes, which corresponds to a known type of detachment annealing. In FIGS. 3, 4a, 4b and 4c, the implantation conditions are those mentioned previously.

FIG. 3 clearly indicates, as known and mentioned previously, that the act of increasing the detachment annealing temperature improves the roughness quality (reduces the roughness measurement). In fact, as illustrated in FIG. 3, the average roughness improves when the maximum detachment annealing temperature increases, regardless of the duration of exposure. In addition, FIG. 3 indicates that the act of reducing the exposure duration at a high temperature allows detachment annealing to be carried out at higher temperatures in good conditions. More precisely, it has been observed in the structures, the qualities of which are illustrated in FIG. 3, that it was in practice difficult, or even impossible, to correctly detach the layer to be transferred for detachment temperatures greater than 700° C. (in the case of a 30 minute exposure duration at this detachment temperature) and greater than 750° C. (in the case of a 10 minute exposure duration). This is comparable to the results illustrated in FIGS. 4a, 4b and 4c. In fact, it is noted in these figures that the act of raising the maximum temperature leads to increased tearings on the edges of the transferred layer of the structure obtained, meaning that it was difficult to detach the substrates. In addition, a phenomenon of reattachment due to the Silicon-Silicon bonds is noted at these high temperatures. In FIG. 4c, numerous tearings are thus visible on the edges of the wafer.

Figure 5:
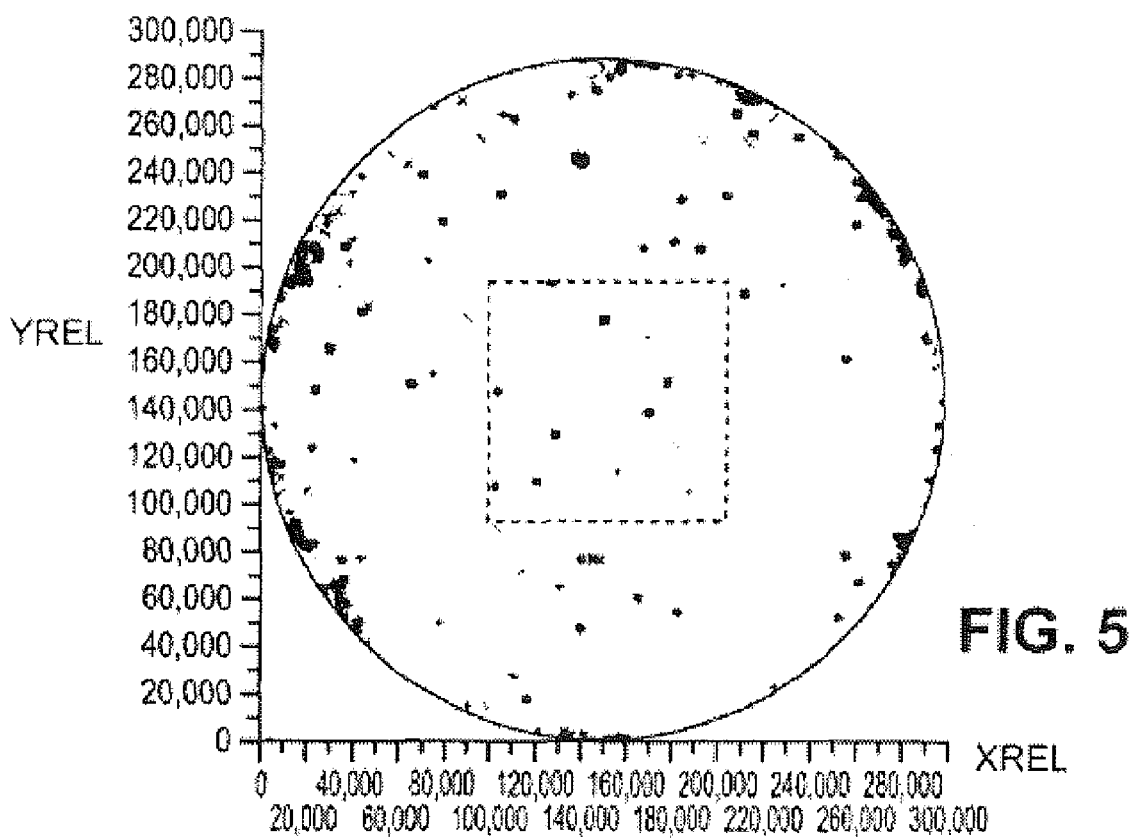
FIG. 5 is a map of defects observed after detachment on an SOI structure obtained by implementing detachment annealing according to the present method using a maximum temperature equal to 675° C.
Figures 6, 9:
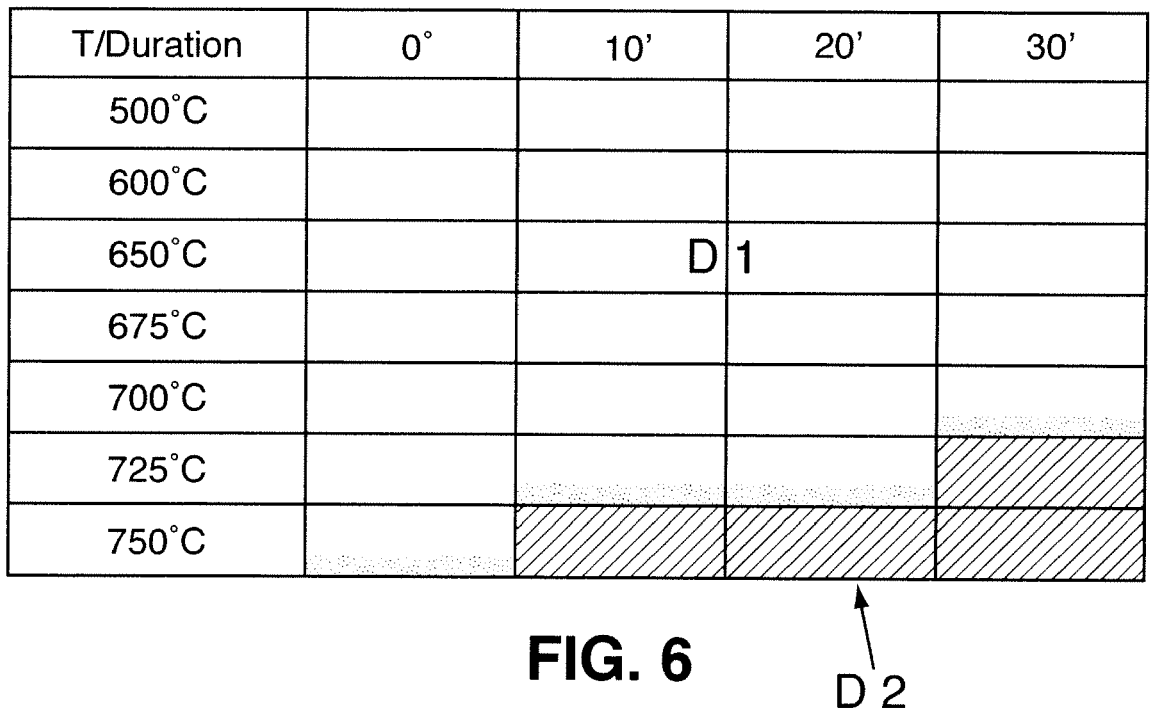
FIG. 6 is a table illustrating the results obtained in terms of ease of detachment in structures having undergone detachment annealings in which the value of the maximum temperature and the duration of exposure to the maximum temperature are variable.
FIG. 9 is a table grouping together the "feasibility" of detachment by carrying out detachment annealing according to the present method for different implantation conditions and for several maximum temperature values.

The tearing phenomenon is reduced when detachment annealing according to the present invention is put in place as is seen in FIG. 5 where, in comparison with FIG. 4c (which corresponds to the same maximum temperature value), defects on the edges have markedly decreased. The table of FIG. 6 illustrates, in an overall manner, the advantage that reducing the duration of exposure at a high temperature presents. In fact, it has been shown that the act of increasing the maximum temperature improves roughness after detachment but that this is likely to lead to reattachment of the substrates.

The table of FIG. 6 illustrates the results in terms of the defectivity obtained after various detachment annealing conditions (maximum temperature value, duration of exposure at a given maximum temperature). In this table, white boxes mean that acceptable detachment was achieved, and shaded boxes indicate that it was difficult but not impossible to separate the substrates. Black boxes indicate that the substrates were highly impaired or even broken, which results from excessive reattachment. For example, for an exposure duration of 30 minutes at a maximum temperature greater than 750° C., it was not possible to detach the substrates, while detachment was possible for a lower exposure duration at the same maximum temperature.

The table from FIG. 6 identifies a limit L that delimits the limiting conditions determined by the value of the maximum temperature during detachment annealing (designated HT) and by the duration of exposure to this highest temperature (designated D), that provide a structure with good quality in terms of defectivity to be obtained. This limit L separates two fields: D1 and D2. Field D1 corresponds to acceptable conditions. Field D2 corresponds to conditions that lead to a defectivity that is too significant. According to the present invention, detachment annealing is carried out in field D1; that is, the maximum temperature value and the exposure duration are maintained at values lower than the limit value.

It is observed that limit L substantially corresponds to conditions in which duration D is a linear function of the maximum temperature HT. More precisely, limit L may be characterized as corresponding to the equation:

$$D = -\tfrac{3}{5} HT + 450.$$

Using the demonstration of this limit, it is possible to optimize the exposure at high temperatures by choosing a duration D and a maximum temperature HT that corresponds to a point less than or equal to the limit L.

In a variation of this embodiment, exposure to the maximum temperature reached during detachment annealing is null, or zero, and the temperature is caused to decrease as soon as the maximum temperature has been reached. This particularly corresponds to the example of FIG. 1.

Figure 7:
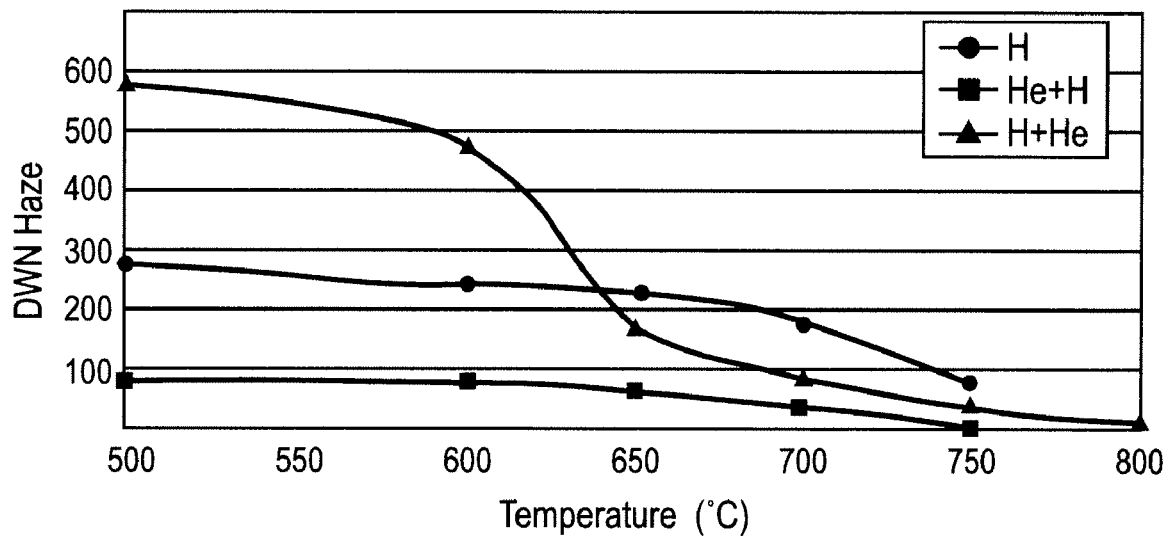
FIG. 7 is a graph showing the average roughness (expressed in DWN Haze) of an SOI structure after detachment according to the maximum temperature reached during detachment annealing, each of these structures having been obtained by a different type of implantation (Hydrogen+Helium, Helium+Hydrogen, and Hydrogen)
Figure 8:
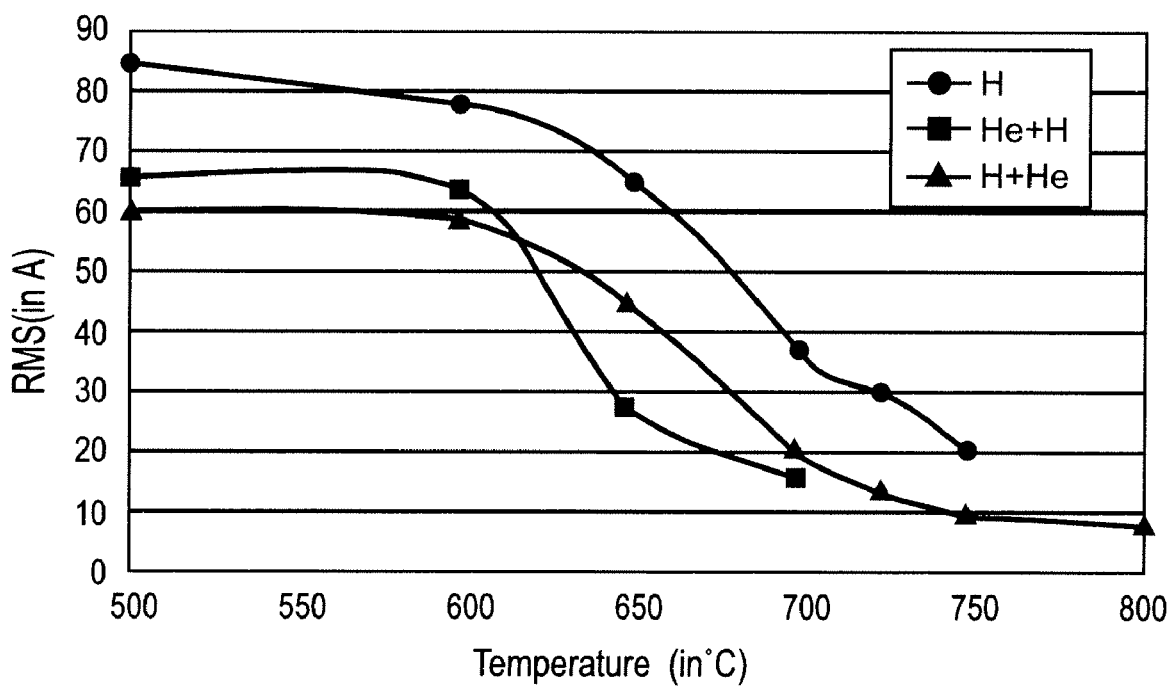
FIG. 8 is a graph showing the average local roughness RMS measured on 10×10 µm² surfaces according to the maximum temperature reached during detachment annealing, each of these structures having been obtained by a different type of implantation (Hydrogen+Helium, Helium+Hydrogen, and Hydrogen)

FIGS. 7 and 8 illustrate the roughnesses obtained at the end of detachment annealing on SOI structures for different maximum temperature values for the detachment annealing and for different variations of implantation. In these figures, it is specified that:

When the maximum detachment annealing temperature is equal to 500° C., the annealing utilized is of the known type, with a range at 500° C. for 30 minutes (see FIG. 2); and When the maximum detachment annealing temperature is greater than 500° C., the annealing presents a maximum temperature greater than 500° C. and is immediately reduced, according to an embodiment of the invention (see FIG. 1).

In FIG. 7, the DWN haze is represented as a function of the maximum detachment annealing temperature (between 500° C. and 800° C.), measured on an SOI structure for the three types of implantation variations. The general progression of the DWN haze is found, which diminishes for the highest maximum temperatures. This reduction, which corresponds to an improved surface condition, is particularly significant for a maximum temperature greater than 600° C. It is also remarked that the most important gain is observed for the H+He co-implantation variation. In fact, for a temperature of less than 650° C., the DWN haze is very high, but from 650° C., it diminishes and rapidly catches up with the DWN haze from the He+H variation.

The observations made in SPI scanning, and illustrated in FIG. 7, are to be correlated with the roughness measurements taken by an atomic force microscope (AFM). This allows the roughness characterized by a root mean square (RMS) of the size of defects to be determined by scanning a part or parts of the surface measured over 2×2 µm² to 40×40 µm² areas using the microscope. This RMS roughness is expressed in Angstroms (Å). The RMS roughness measured over 10×10 µm² areas of the detachment surfaces of SOI structures according to the maximum temperature of the detachment annealing heat budget is thus represented in FIG. 8. The RMS roughness decreases according to the maximum detachment annealing temperature. It is to be remarked that the two co-implantation variations present roughnesses of less than those from the H variation. In addition, for the three variations, it has been observed that it is particularly advantageous to bring the detachment annealing to temperatures greater than 600° C. From 750° C., the two co-implantation variations allow surfaces with equivalent roughnesses to be obtained.

In all cases, detachment annealing is brought to a maximum temperature while minimizing the duration of exposure to the maximum temperature (in particular, to heal or, in any case, reduce the surface defects issued from the detachment). For the three variations of implantations tested, the table of FIG. 9 illustrates (on the same principle as the table of FIG. 6), the feasibility of detaching the substrates after detachment annealing according to the invention in the variation where the temperature decreases as soon as the maximum temperature H is reached during detachment. This table indicates that the H+He implantation produces the best results in terms of defectivity. This identifies this type of implantation as the most advantageous while it may be considered equivalent to an He+H implantation under roughness alone.

Using these results, it is possible to determine the absolute limit for the maximum temperature for detachment annealing according to the invention. Accordingly, it has been determined that for the three implantation variations, it was not possible to detach the wafers when the maximum temperature was greater than 800° C.

The invention also allows the benefit of an improved surface condition after detachment, thanks to exposure to a high temperature while delaying the appearance of defects due to reattachment by limiting the duration of exposure to a predetermined maximum temperature.

The results shown herein show that the heat budget of the present invention allows the surface condition of the structure obtained to be improved when the temperature is greater than 500° C., and more particularly greater than about 600° C. and less than or equal to about 750° C. It is also to be noted that particularly advantageous results are obtained by utilizing a variation of co-implantation during the step of ion species implantation. And, H+He co-implantation produces particularly advantageous results in terms of defectivity. In addition, the method of the present invention allows the duration of SMART-CUT® type methods to be reduced, as the detachment annealing duration is reduced.

SOI type structures obtained after detachment annealing according to the present invention present a roughness that is less than the roughnesses obtained according to known types of detachment annealing (conducted within high temperature range). This roughness is typically from 70 to 100 Å RMS for implantation of hydrogen alone and for a maximum detachment annealing temperature of 500° C.

The examples described herein focus on SOI structures; however, one skilled in the art may easily transpose the present invention to other types of structures that may be obtained using SMART-CUT® type methods. In particular, results comparable to those described herein have been obtained for sSOI structures in which the implantation and fracture are carried out in relaxed SiGe. More generally, the invention is applicable to any structure obtained by layer transfer according to the steps referred to above.

What is claimed is:

1. A method of forming a structure, which comprises:
    implanting atomic species through an upper surface of a donor substrate and to a given depth relative to the upper surface to form an embrittlement zone in the donor substrate, the embrittlement zone defining a removable layer within the donor substrate;
    assembling the upper surface of the donor substrate to a receiver substrate;
    detaching the removable layer from the donor substrate at the embrittlement zone, thereby forming a detachment surface on the removable layer, with the detaching achieved by a high temperature annealing which includes a temperature upgrade phase for heating to a predetermined maximum temperature, a maximum temperature maintaining phase for a predetermined exposure duration which is less than or equal to a limit that is a linear function of the maximum temperature, and a temperature downgrade phase, with the maximum temperature and the exposure duration being selected so as to prevent the appearance of significant defects at the detachment surface.

2. The method of claim 1, wherein the linear function is of the form $$D=-3/5HT+450,$$

where HT is the maximum temperature expressed in degrees Celsius and D is the exposure duration expressed in minutes.

3. The method of claim 1, wherein the exposure duration is equal to the limit.

4. The method of claim 1, wherein the exposure duration is substantially null and the maximum temperature is substantially 750° C.

5. The method of claim 4, wherein the temperature upgrade phase is immediately followed by the temperature downgrade phase once the maximum temperature is reached.

6. The method of claim 1, wherein the temperature upgrade phase begins at a temperature of about 200 degrees Celsius.

7. The method of claim 1, wherein the temperature upgrade phase is preceded by prolonged exposure to an initial temperature.

8. The method of claim 7, wherein the initial temperature is about 200 degrees Celsius.

9. The method of claim 7, wherein the prolonged exposure is carried out for approximately 30 minutes.

10. The method of claim 1, wherein the temperature upgrade phase includes a temperature increase at a rate of about 10° C. per minute.

11. The method of claim 1, wherein the temperature downgrade phase includes a temperature decrease at a rate of about 10° C. per minute.

12. The method of claim 1, wherein the maximum temperature is greater than 500° C.

13. The method of claim 12, wherein the maximum temperature is greater than 600° C.

14. The method claim 1, wherein the step of implanting an atomic species into a donor substrate includes co-implantation.

15. The method of claim 14, wherein the co-implantation is of hydrogen and helium species.

16. The method of claim 15, wherein the hydrogen species is implanted before the helium species is implanted.

17. A method of forming a structure, which comprises:

implanting atomic species through an upper surface of a donor substrate to a given depth relative to the upper surface to form an embrittlement zone in the donor substrate, the embrittlement zone defining a removable layer within the donor substrate;

assembling the upper surface of the donor substrate to a receiver substrate;

detaching the removable layer from the donor substrate at the embrittlement zone, thereby forming a detachment surface on the removable layer, with the detaching achieved by a high temperature annealing which includes a temperature upgrade phase for heating to a maximum temperature that is between 700° C. and 750° C., a maximum temperature maintaining phase for a predetermined exposure duration which is less than or equal to a limit that is a linear function of the maximum temperature, and a temperature downgrade phase, with the maximum temperature and the exposure duration being selected so as to prevent the appearance of significant defects at the detachment surface.

18. The method claim 17, wherein the step of implanting an atomic species into a donor substrate includes co-implantation.

19. The method of claim 18, wherein the co-implantation is of hydrogen and helium species.

20. The method of claim 19, wherein the hydrogen species is implanted before the helium species is implanted.

* * * * *